(12) United States Patent
Kubota

(10) Patent No.: US 6,913,057 B2
(45) Date of Patent: Jul. 5, 2005

(54) IC-CARD MANUFACTURING APPARATUS

(75) Inventor: Suinobu Kubota, Nagano (JP)

(73) Assignee: Nissei Plastic Industrial Co., Ltd., Nagano-ken (JP)

( * ) Notice: Subject to any disclaimer, the term of this patent is extended or adjusted under 35 U.S.C. 154(b) by 363 days.

(21) Appl. No.: 10/273,142

(22) Filed: Oct. 18, 2002

(65) Prior Publication Data

US 2003/0075275 A1 Apr. 24, 2003

(30) Foreign Application Priority Data

Oct. 19, 2001 (JP) ........................................ 2001-321832

(51) Int. Cl.$^7$ .............................................. B32B 31/20
(52) U.S. Cl. .................... 156/382; 156/580; 100/305; 100/315
(58) Field of Search ............................... 100/264, 211, 100/305, 315–321, 324–326; 156/228, 285–286, 311, 381–382, 358, 366–368, 580–581, 583.1, 583.2, 583.3, 583.8, 583.9; 257/679, 724; 361/737; G06K 19/077

(56) References Cited

U.S. PATENT DOCUMENTS 6,522,549 B2 * 2/2003 Kano et al. ................. 361/737

FOREIGN PATENT DOCUMENTS

| GB | 2279610 | * | 1/1995 | ......... G06K/19/077 |
| JP | 2-16234 B2 | | 4/1990 | |
| JP | 6-176214 A | | 6/1994 | |
| JP | 9-277766 A | | 10/1997 | |
| JP | 11-48660 A | | 2/1999 | |
| JP | 2000-182014 A | | 6/2000 | |
| JP | 2000-194814 | * | 7/2000 | ......... G06K/19/077 |

* cited by examiner

Primary Examiner—Jessica Rossi
(74) Attorney, Agent, or Firm—Birch, Stewart, Kolasch & Birch, LLP

(57) ABSTRACT

An IC-card manufacturing apparatus manufactures an IC card from a laminated substrate including an electronic component and laminate materials which sandwich the electronic component. The IC-card manufacturing apparatus includes a laminated-substrate sandwiching unit which includes upper and lower sandwiching sections for sandwiching the laminated substrate in a sealed state; an evacuation unit for evacuating air from the interior of the laminated substrate; and an evacuation mechanism section which sandwiches the laminated-substrate sandwiching unit in order to form an upper evacuation chamber above the upper sandwiching section and a lower evacuation chamber below the lower sandwiching section and which evacuates air from the upper and lower evacuation chambers by use of the evacuation unit.

8 Claims, 7 Drawing Sheets

BACKGROUND ART

FIG.8

IC-CARD MANUFACTURING APPARATUS

This nonprovisional application claims priority under 35 U.S.C. § 119(a) on Patent Application No. 2001-321832 filed in JAPAN on Oct. 19, 2001, which is herein incorporated by reference.

BACKGROUND OF THE INVENTION

1. Field of the Invention

The present invention relates to an IC-card manufacturing apparatus suitable for manufacture of thin, non-contact-type IC cards.

2. Description of the Related Art

IC cards containing electronic components such as IC chips are generally known. Such an IC card must be manufactured such that the card has no uneven surface which would otherwise result from accommodation of an electronic component therein. Methods and apparatuses for manufacturing such an IC card have been proposed in Japanese Patent Publication No. 2(1990)-16234 and in Japanese Patent Application Laid-Open Nos. 6(1994)-176214, 9(1997)-277766, and 11(1999)-48660.

Meanwhile, a thin, flexible, non-contact-type IC card having a thickness of a few hundreds of micrometers has recently been put in practical use; and the present inventor has proposed an IC-card manufacturing apparatus suitable for manufacture of such a thin, non-contact-type IC card (see Japanese Patent Application Laid-Open No. 2000-182014). The IC-card manufacturing apparatus is designed to manufacture an IC card through thermocompression bonding of a laminated substrate consisting of two sheet materials (laminate materials) which sandwich an electronic component such as an IC chip. Specifically, the IC-card manufacturing apparatus includes a laminated-substrate sandwiching unit consisting of upper and lower sandwiching sections for sandwiching a laminated substrate in a sealed state; and an evacuation unit for evacuating air from the interior of the laminated-substrate sandwiching unit. The evacuated laminated-substrate sandwiching unit which carries the laminated substrate is successively processed by a pre-heating press unit, a thermocompression-bonding press unit, and a cooling press unit, whereby IC cards are fabricated.

However, the above-described IC-card manufacturing apparatus has the following problem to be solved.

Figure 3:
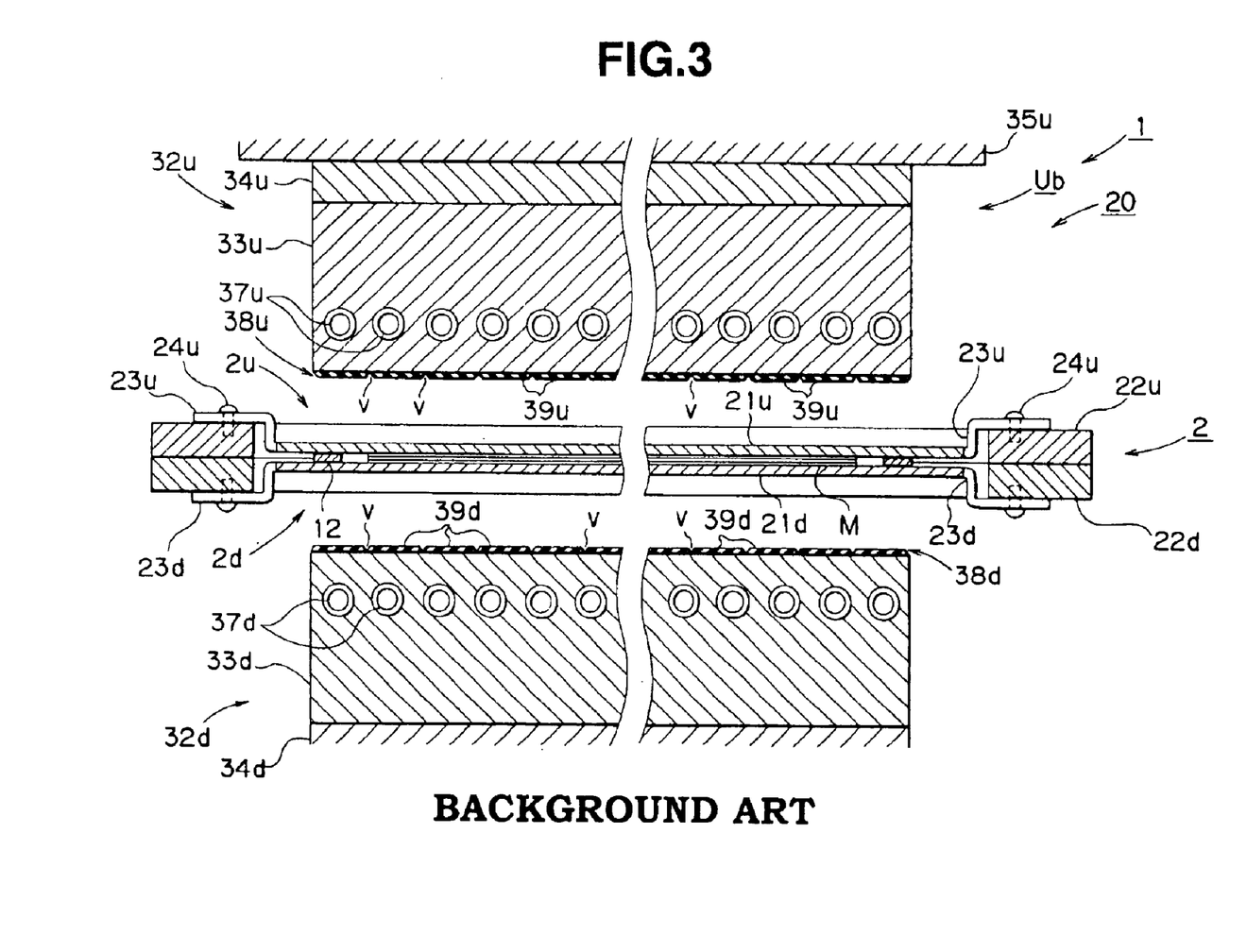
FIG. 3 is a sectional front view of a main portion of a thermocompression-bonding press unit of the IC-card manufacturing apparatus.
Figure 7:
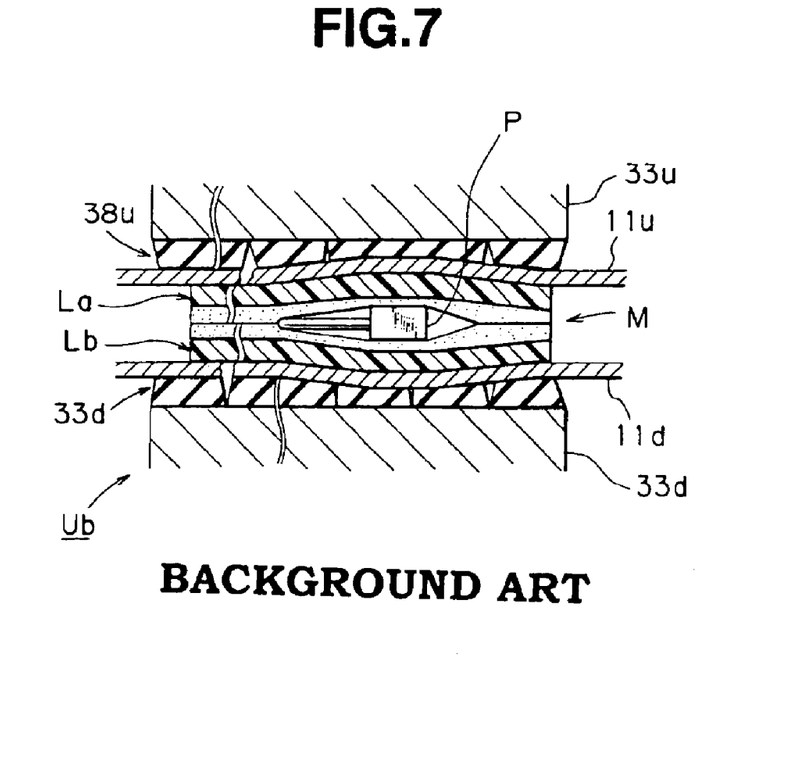
FIG. 7 is a schematic vertical cross section of the main portion used for explaining operation of the IC-card manufacturing apparatus.

As shown in FIG. 3, a laminated substrate M is sandwiched between an upper pressure plate 21u of an upper sandwiching section 2u and a lower pressure plate 21d of a lower sandwiching section 2d. Before start of evacuation, the laminated substrate M has a thickness greater than a target thickness that the laminated substrate M must have after completion of thermocompression bonding, whereas the thickness (height) of a seal member (inner seal member) 12 of a laminated-substrate sandwiching unit 2, which surrounds the laminated substrate M, is adjusted to the target thickness. Therefore, when evacuation is started, in a region outside the laminated substrate M, the distance between the upper pressure plate 21u and the lower pressure plate 21d of the laminated-substrate sandwiching unit 2 becomes smaller as compared with a region where the laminated substrate M is present. As a result, as shown in FIG. 7, a peripheral portion of the laminated substrate M is sealed under a higher pressure as compared with a central portion thereof. Therefore, even when the evacuation process proceeds, air confined within the central portion of the laminated substrate M is not removed, so that sufficient and reliable evacuation of the laminated substrate M cannot be performed.

SUMMARY OF THE INVENTION

An object of the present invention is to provide an IC-card manufacturing apparatus which can perform sufficient evacuation of a laminated substrate in a reliable manner to thereby enhance quality and homogeneity of IC cards.

Another object of the present invention is to provide an IC-card manufacturing apparatus in which a plurality of mechanisms are consolidated in order to reduce costs and size of the apparatus.

In order to achieve the above objects, the present invention provides an IC-card manufacturing apparatus for manufacturing an IC card from a laminated substrate consisting of an electronic component and laminate materials which sandwich the electronic component, the IC-card manufacturing apparatus comprising: a laminated-substrate sandwiching unit which includes upper and lower sandwiching sections for sandwiching the laminated substrate in a sealed state; an evacuation unit for evacuating air from the interior of the laminated-substrate sandwiching unit; and an evacuation mechanism section which sandwiches the laminated-substrate sandwiching unit in order to form an upper evacuation chamber above the upper sandwiching section and a lower evacuation chamber below the lower sandwiching section and which evacuates air from the upper and lower evacuation chambers by use of the evacuation unit. The evacuation mechanism section may be provided in a pre-heating unit for pre-heating the laminated-substrate sandwiching unit.

DETAILED DESCRIPTION OF THE PREFERRED EMBODIMENT

An embodiment of the present invention will next be described in detail with reference to the drawings. The accompanying drawings are illustrative of the embodiment and are not meant to limit the scope of the invention. In order to describe the invention clearly, detailed description of known parts is omitted.

First, the configuration of an IC-card manufacturing apparatus 1 according to the present embodiment will be described with reference to FIGS. 1 to 6.

Figure 1:
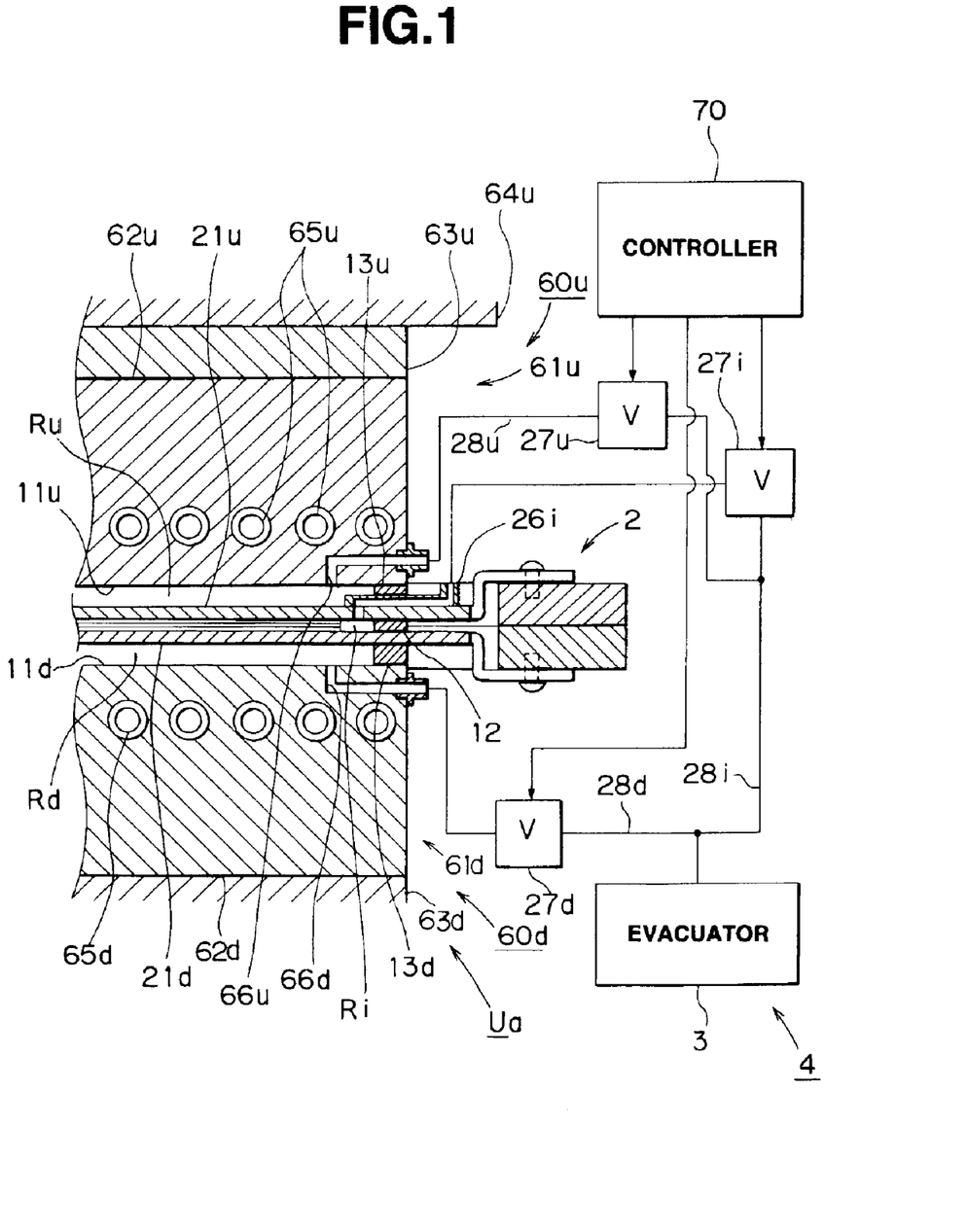
FIG. 1 is a sectional front view of a main portion of a pre-heating unit of an IC-card manufacturing apparatus according to an embodiment of the present invention.

The IC-card manufacturing apparatus 1 comprises a manufacturing apparatus main body 20 and a laminated-substrate sandwiching unit 2 which is configured to be independent of the manufacturing apparatus main body 20. As shown in FIGS. 1 and 3, the laminated-substrate sandwiching unit 2 includes an upper sandwiching section 2u and a lower sandwiching section 2d. The upper sandwiching section 2u is superposed on the lower sandwiching section 2d in order to constitute the laminated-substrate sandwiching unit 2 whose interior is sealed.

Figure 5:
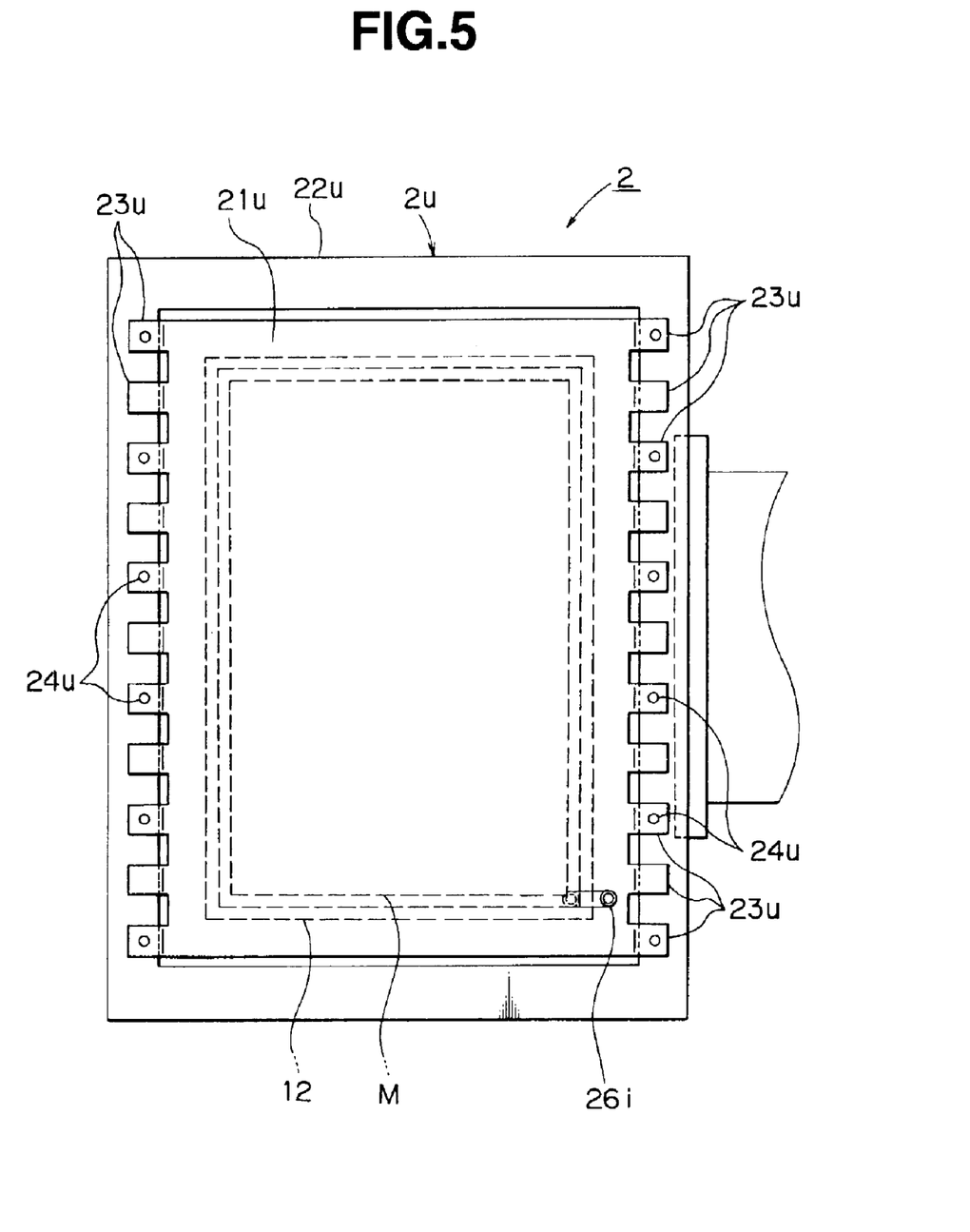
FIG. 5 is a plan view of a laminated-substrate sandwiching unit of the IC-card manufacturing apparatus.

The upper sandwiching section 2u has an upper pressure plate 21u and an upper rectangular frame portion 22u larger than the upper pressure plate 21u. The upper pressure plate 21u is connected to the upper frame 22u via a plurality of rectangular connection strips 23u, which are formed integrally with the upper pressure plate 21u. As shown in FIG. 5, the connection strips 23u project from the opposite side edges of the upper pressure plate 21u at constant intervals along the corresponding side edges; and the connection strips 23u are bent into a crank shape. All or some of the connection strips 23u are fixed at their tip ends to the upper frame 22u by means of fixing screws 24u. This configuration absorbs thermal deformation of the upper pressure plate 21u.

The upper pressure plate 21u is formed of an elastic plate having a predetermined thickness; preferably, a stainless sheet having a thickness of about 1 mm, such that in a state in which a laminate material La is not softened, the upper pressure plate 21u elastically deforms in accordance with deformation of the laminate material La upon application of pressure to the laminated substrate M, and when the laminate material La is softened, the upper pressure plate 21u elastically restores its original shape. The upper pressure plate 21u may be formed of other elastic metal plate, or an elastic non-metal plate having heat resistance such as an elastic synthetic resin plate made of, for example, polyimide.

The lower sandwiching section 2d basically has the same basic configuration as that of the upper sandwiching section 2u. In the lower sandwiching section 2d, reference numeral 21d denotes a lower pressure plate; 22d denotes a lower frame; and 23d denotes a plurality of connection strips. A inner seal member 12 is fixed onto the upper surface of the lower pressure plate 21d such that the inner seal member 12 extends along the peripheral edge of the lower pressure plate 21d. The thickness (height) of the inner seal member 12 is adjusted to a target thickness that the laminated substrate M must has after thermocompression bonding.

As shown in FIG. 1 (FIG. 5), an evacuation port 26i is provided on the upper pressure plate 21u. The evacuation port 26i is connected to an evacuator (e.g., vacuum pump) 3 via a connection pipe 28i, in which a solenoid open-close valve 27i is provided. This configuration enables evacuation of air from the interior Ri of the laminated-substrate sandwiching unit 2. In place of the solenoid open-close valve 27i, a solenoid-type three-way valve may be interposed in the connection pipe 28i in order to enable supply of air into the interior Ri of the laminated-substrate sandwiching unit 2 from the evacuation port 26i. Notably, an unillustrated positioning member is provided at a predetermined position on each of the upper and lower frames 22u and 22d in order to enable mutual positioning between the upper and lower frames 22u and 22d when the upper frame 22u is placed on the lower frame 22d.

Meanwhile, the manufacturing apparatus main body 20 has three process units; i.e., a pre-heating unit Ua+ (shown in FIG. 1), a thermocompression-bonding press unit Ub (shown in FIGS. 3 and 4), and a cooling unit (not shown).

Figure 4:
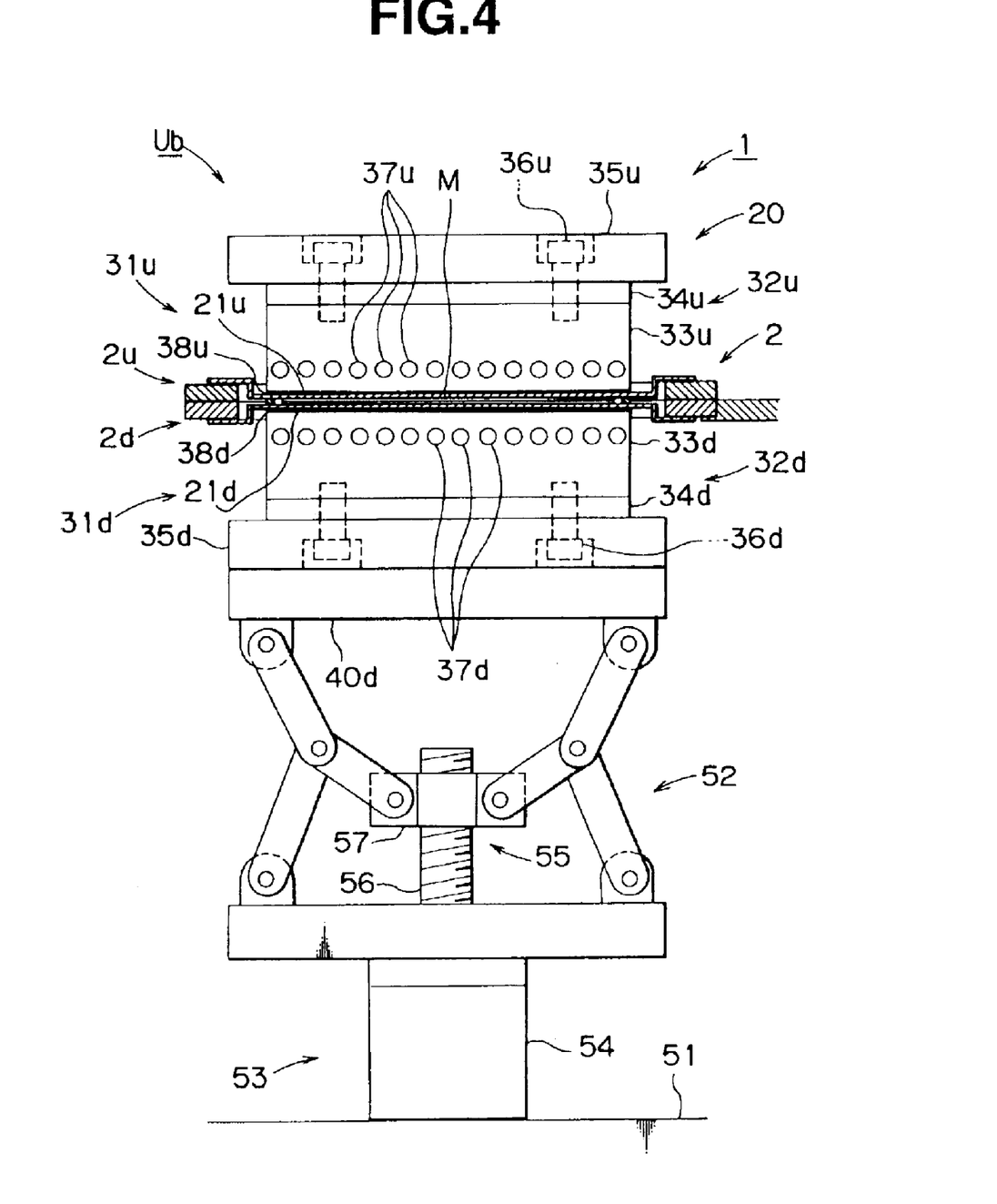
FIG. 4 is a partially-sectioned front view of the thermocompression-bonding press unit of the IC-card manufacturing apparatus.

As shown in FIG. 4, the thermocompression-bonding press unit Ub has a stationary press platen 31u disposed on the upper side and a movable press platen 31d disposed on the lower side. The stationary press platen 31u is provided with a press-platen main body 32u. As shown in FIG. 3, the press-platen main body 32u is composed of a support platen 35u, a heat-insulating member 34u, and a hot platen member 33u, which are successively stacked and integrated into a single unit by means of fixing bolts 36u. A lower surface of the hot platen member 33u serves as a press surface. Unlike the lower-side press-platen main body 32d to be described later, the press-platen main body 32u is fixed directly to an unillustrated, fixed press-platen base. A large number of bar heaters 37u are embedded in the hot platen member 33u. A cushion sheet 38u formed of an elastic material such as rubber and having a predetermined thickness is bonded to the lower surface of the hot platen member 33u. Since the cushion sheet 38u has a high thermal insulation performance, the cushion sheet 38u must be made as thin as possible in order to improve thermal conductivity. In the present embodiment, a silicone rubber sheet having a thickness of about 0.3 mm is used. When such a thin silicone rubber sheet is bonded to the flat press surface whose sides each have a length of at least several tens of centimeters, a desired elasticity cannot be attained. In view of this, grooves v having a predetermined width are formed on the lower surface of the cushion sheet 38u to thereby form a large number of sections or projections 39u. By virtue of this configuration, the cushion sheet 38u provides a sufficiently high degree of heat conductivity and a sufficient and proper degree of elasticity.

Meanwhile, as shown in FIG. 4, the movable press platen 31d includes a press-platen main body 32d and a press-platen base 40d supporting the press-platen main body 32d. As shown in FIG. 3, the press-platen main body 32d is composed of a support platen 35d, a heat-insulating member 34d, and a hot platen member 33d, which are successively stacked and integrated into a single unit by means of fixing bolts 36d. An upper surface of the hot platen member 33d serves as a press surface. A large number of bar heaters 37d are embedded in the hot platen member 33d. A cushion sheet 38d is bonded to the upper surface of the hot platen member 33d. The cushion sheet 38d is formed of the same material as that of the above-described cushion sheet 38u. Therefore, grooves v are formed on the upper surface of the cushion sheet 38d to thereby form a large number of projections 39d, as in the case of the cushion sheet 38u.

Reference numeral 51 denotes a machine base. The movable press platen 31d is supported by a toggle link mechanism 52 disposed between the machine base 51 and the movable press platen 31d. Reference numeral 53 denotes a drive mechanism for driving the toggle link mechanism 52. The drive mechanism 53 includes a servomotor 54 attached to the machine base 51, and a ball-screw mechanism 55 driven by the servomotor 54. A ball screw 56 of the ball-screw mechanism 55 is rotated by the servomotor 54. A nut 57 of the ball-screw mechanism 55 serves as an input member of the toggle link mechanism 52.

FIG. 1 shows the pre-heating unit Ua. The pre-heating unit Ua has a stationary platen 60u disposed on the upper side, and a movable platen 60d disposed on the lower side. The movable platen 60d is supported by a mechanism similar to the toggle link mechanism 52 and the drive mechanism 53 used in the thermocompression-bonding press unit Ub shown in FIG. 4. The stationary platen 60u is provided with a platen main body 61u. The platen main body 61u is composed of a support platen 64u, a heat-insulating member 63u, and a hot platen member 62u, which are successively stacked and integrated into a single unit by means of unillustrated fixing bolts. A lower surface of the hot platen member 62u serves as an upper heating surface 11u. The platen main body 61u is fixed directly to an unillustrated stationary base. A large number of bar heaters 65u are embedded in the hot platen member 62u. An upper seal member 13u is fixed onto the upper heating surface 11u such that the upper seal member 13u extends along the peripheral edge of the upper heating surface 11u. As shown in FIG. 1, the position of the upper seal member 13u coincides with that of the inner seal member 12 when the laminated-substrate sandwiching unit 2 is sandwiched between the stationary platen 60u and the movable platen 60d. When the thickness (height) of the upper seal member 13u is increased excessively, the preheating performance of the unit is deteriorated. Therefore, the thickness (height) of the upper seal member 13u is desirably set to about 1 to 2 mm. Moreover, an evacuation passage 66u is formed within the hot platen member 62u in such a manner that the inner end of the evacuation passage 66u reaches the upper heating surface 11u at a location inside of the upper seal member 13u, and the outer end of the evacuation passage 66u reaches the outer side surface of the hot platen member 62u. The outer end of the evacuation passage 66u is connected to the evacuator 3 via a connection pipe 28u, in which a solenoid open-close valve 27u is provided. When the laminated-substrate sandwiching unit 2 is sandwiched between the stationary platen 60u and the movable platen 60d, there is formed an upper evacuation chamber Ru which the upper sandwiching section 2u faces and which is surrounded by the upper sandwiching section 2u, the upper heating surface 11u, and the upper seal member 13u.

Meanwhile, the movable platen 60d is provided with a platen main body 61d. The platen main body 61d is composed of a heat-insulating member 63u, a hot platen member 62, etc., which are successively stacked and integrated into a single unit by means of unillustrated fixing bolts. An upper surface of the hot platen member 62d serves as a lower heating surface 11d. A large number of bar heaters 65d are embedded in the hot platen member 62d. A lower seal member 13d is fixed onto the lower heating surface 11d such that the lower seal member 13d extends along the peripheral edge of the lower heating surface 11d. As shown in FIG. 1, the position of the lower seal member 13d coincides with that of the inner seal member 12 when the laminated-substrate sandwiching unit 2 is sandwiched between the stationary platen 60u and the movable platen 60d. As in the case of the upper seal member 13u, the lower seal member 13d has a thickness (height) which is desirably set to about 1 to 2 mm. Moreover, an evacuation passage 66d is formed within the hot platen member 62d in such a manner that the inner end of the evacuation passage 66d reaches the lower heating surface 11d at a location inside of the lower seal member 13d, and the outer end of the evacuation passage 66d reaches the outer side surface of the hot platen member 62d. The outer end of the evacuation passage 66d is connected to the evacuator 3 via a connection pipe 28d, in which a solenoid open-close valve 27d is provided. When the laminated-substrate sandwiching unit 2 is sandwiched between the stationary platen 60u and the movable platen 60d, there is formed a lower evacuation chamber Rd which the lower sandwiching section 2d faces and which is surrounded by the lower sandwiching section 2d, the lower heating surface 11d, and the lower seal member 13d.

The solenoid open-close valves 27u, 27d, and 27i are connected to a controller 79 having a computer function and are controlled in accordance with a previously set sequence program. Therefore, the above-described structural components constitute an evacuation mechanism section 4, in which through sandwiching the laminated-substrate sandwiching unit 2 between the stationary platen 60u and the movable platen 60d, the upper evacuation chamber Ru which the upper sandwiching section 2u faces and the lower evacuation chamber Rd which the lower sandwiching section 2d faces are formed; and these upper and lower evacuation chambers Ru and Rd can be evacuated by means of the evacuator 3.

Figure 2:
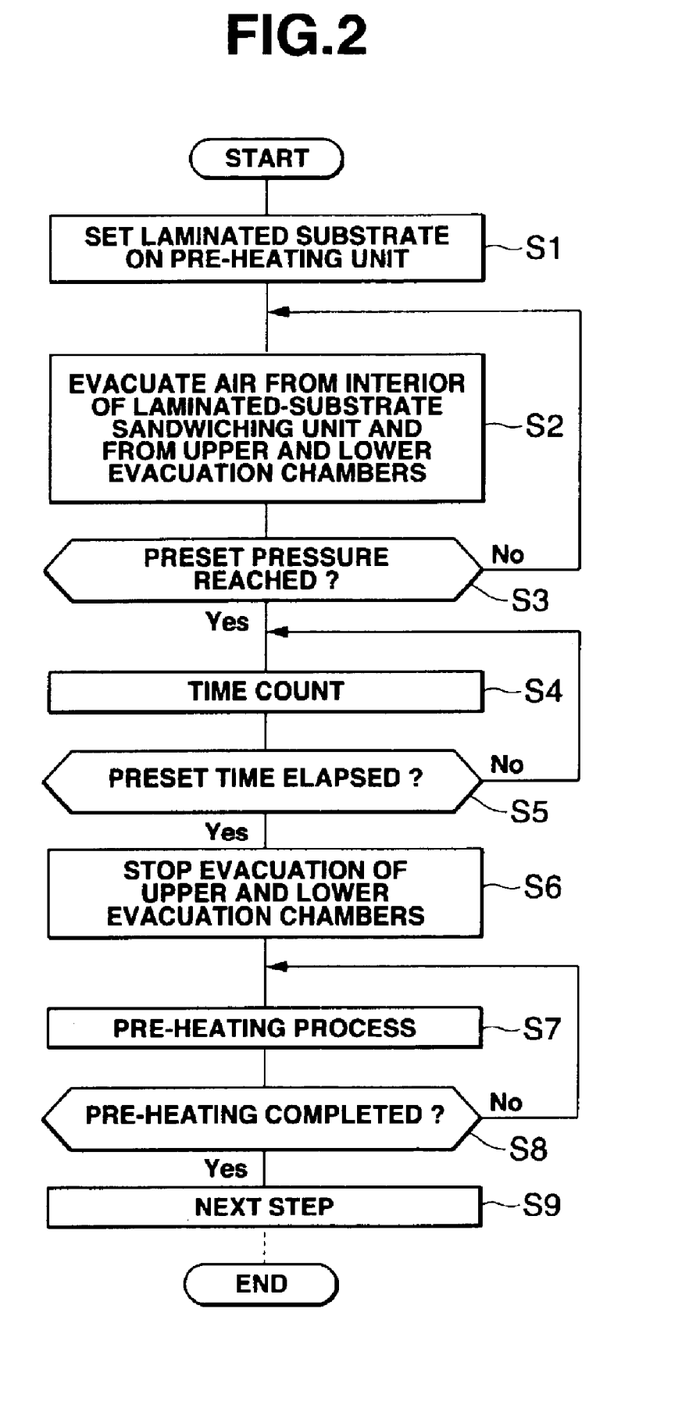
FIG. 2 is a flowchart showing the detail steps of an evacuation process in a method of manufacturing an IC-card by use of the IC-card manufacturing apparatus.

Next, operation (function) of the IC-card manufacturing apparatus 1 and a method of manufacturing an IC card will be described in accordance with the flowchart of FIG. 2 and with reference to the remaining drawings.

Figure 6:
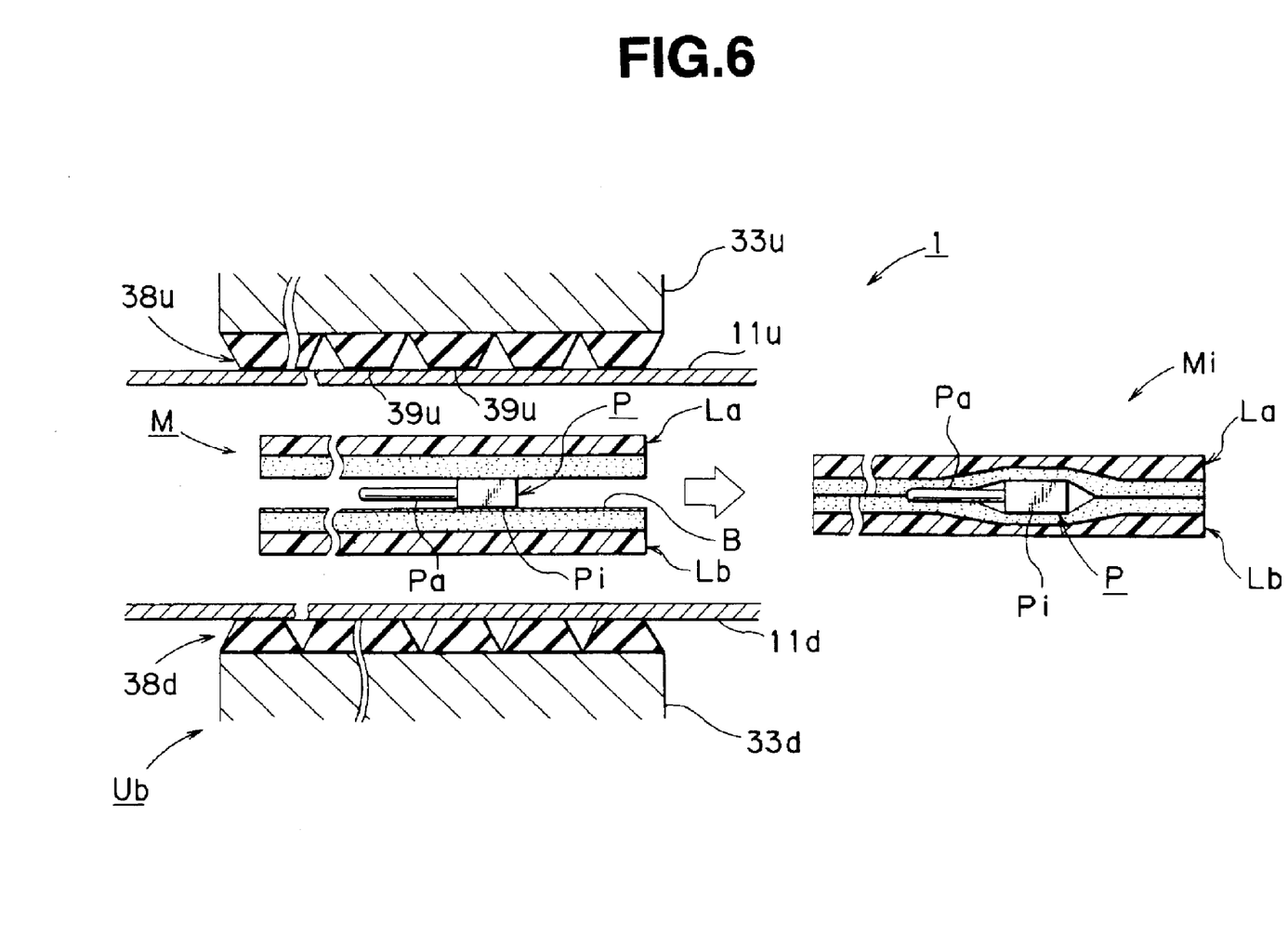
FIG. 6 is a schematic vertical cross section of a main portion of the IC-card manufacturing apparatus, accompanied by a schematic vertical cross section of an IC card manufactured by use of the IC-card manufacturing apparatus.

First, a laminated substrate M is fabricated by use of laminate materials La and Lb. FIG. 6 shows the laminated substrate M. Each of the laminate materials La and Lb is a layered sheet consisting of two to six thermoplastic resin sheets each having a thickness of about 20 to 300 $\mu$m. The laminate materials La and Lb each include a hot melt sheet and a polyethylene terephthalate sheet. Reference letter P denotes an electronic component consisting of an IC chip Pi and an antenna Pa. The electronic component P is mounted onto a base sheet B, which is then sandwiched between the laminate materials La and Lb in order to yield the laminated substrate M. In general, the laminated substrate M has a size corresponding to a plurality of IC cards (in general, n×m pieces) and includes a plurality of electronic components P corresponding to the plurality of IC cards. After the laminated substrate M undergoes thermocompression bonding performed by the IC-card manufacturing apparatus 1, the laminated substrate M is diced into target IC cards Mi.

The thus-fabricated laminated substrate M is accommodated within the laminated-substrate sandwiching unit 2. Specifically, the laminated substrate M is placed on the lower sandwiching section 2d, and the upper sandwiching section 2u is superposed thereon in order to sandwich the laminated substrate M between the upper sandwiching section 2u and the lower sandwiching section 2d. Subsequently, the laminated-substrate sandwiching unit 2 is set on the pre-heating unit Ua (step S1). Specifically, the laminated-substrate sandwiching unit 2 is placed on the movable platen 60d, which is then moved upward in order to sandwich the laminated-substrate sandwiching unit 2 between the stationary platen 60u and the movable platen 60d, as shown in FIG. 1. As a result, on the upper side of the laminated-substrate sandwiching unit 2, the upper evacuation chamber Ru which the upper surface of the upper sandwiching section 2u faces is defined by the upper sandwiching section 2u, the upper heating surface 11u, and the upper seal member 13u; and on the lower side of the laminated-substrate sandwiching unit 2, the lower evacuation chamber Rd which the lower surface of the lower sandwiching section 2d faces is defined by the lower sandwiching section 2d, the lower heating surface 11d, and the lower seal member 13d. Meanwhile, the pre-heating unit Ua is in a pre-heated state in which the pre-heating unit Ua is heated to a pre-heating temperature lower than a regular heating temperature employed during thermocompression bonding; specifically, to a temperature (e.g., about 70° C.) just below the temperature at which plastic deformation or fusion of the laminate materials La and Lb starts. Therefore, a pre-heating process for the laminated-substrate sandwiching unit 2 starts when the laminated-substrate sandwiching unit 2 is set on the pre-heating unit Ua.

Subsequently, an evacuation process (evacuation step) is performed. First, the controller 70 opens all the solenoid open-close valves 27u, 27d, and 27i and starts the evacuator 3 in order to evacuate air (through vacuum suction) from the upper evacuation chamber Ru, the lower evacuation chamber Rd, and the interior Ri of the laminated-substrate sandwiching unit 2 (step S2). When a previously set vacuum pressure has been attained after start of evacuation, clocking or time count is started (steps S3 and S4). When a previously set period of time (typically, about 10 seconds) has elapsed, the evacuation of the upper evacuation chamber Ru and the lower evacuation chamber Rd is stopped. However, the evacuation of the interior Ri of the laminated-substrate sandwiching unit 2 is continued (steps S5 and S6).

During a period between the start of evacuation and a predetermined time thereafter, the evacuation of the upper evacuation chamber Ru and the lower evacuation chamber Rd and the evacuation of the interior Ri of the laminated-substrate sandwiching unit 2 are performed simultaneously at the same negative pressure. Therefore, as shown in FIG. 1, the laminated substrate M is sandwiched between the upper pressure plate 21u of the upper sandwiching section 2u and the lower pressure plate 21d of the lower sandwiching section 2d. However, since the same negative pressure is created in the interior Ri of the laminated-substrate sandwiching unit 2 and outside thereof (i.e., in the upper evacuation chamber Ru and the lower evacuation chamber Rd), there can be avoided the problem involved in the conventional apparatus which would otherwise occur due to atmospheric pressure acting on the upper surface of the upper pressure plate 21u and the lower surface of the lower pressure plate 21d; i.e., the problem in that in a region outside the laminated substrate M, the distance between the upper pressure plate 21u and the lower pressure plate 21d of the laminated-substrate sandwiching unit 2 becomes smaller as compared with a region where the laminated substrate M is present, and as a result, a peripheral portion of the laminated substrate M is sealed under a higher pressure as compared with a central portion thereof. Therefore, air is evacuated from the laminated substrate M to a sufficient degree without fail. When a predetermined period of time required for sufficient evacuation of air from the interior of the laminated substrate M has elapsed, the evacuation of the upper evacuation chamber Ru and the evacuation of the lower evacuation chamber Rd are stopped. Thus, the evacuation process (evacuation step) is completed. Notably, the interior Ri of the laminated-substrate sandwiching unit 2 is maintained at the established negative pressure.

Meanwhile, simultaneously with the above-described evacuation process, the pre-heating process for heating the laminated-substrate sandwiching unit 2 at the above-described pre-heating temperature has been performed (step S7). When the pre-heating process ends, the laminated-substrate sandwiching unit 2 is transported to the thermocompression-bonding press unit Ub (steps S8 and S9). At this point in time, the movable press platen 31d is located at a descended position, as shown in FIG. 4. Therefore, when the servomotor 54 is operated after placement of the laminated-substrate sandwiching unit 2 on the movable press platen 31d, the nut 57 is moved upward, so that the movable press platen 31d is raised through action of the toggle link mechanism 52. When the laminated-substrate sandwiching unit 2 comes into contact with the upper-side cushion sheet 38u and a very small pressure is applied to the laminated-substrate sandwiching unit 2, the upward movement of the movable press platen 31d is stopped temporarily. The stationary press platen 31u and the movable press platen 31d are heated to a regular heating temperature (e.g., about 140° C.) by the bar heaters 37u and 37d, respectively. Notably, even when the laminated substrate M is moved from the pre-heating unit Ua to the thermocompression bonding press unit Ub, the heated and pressed state is maintained reliably; i.e., the temperature and pressure of the laminated substrate M are maintained, because the laminated substrate M is accommodated within the sealed laminated-substrate sandwiching unit 2 which holds the laminated substrate M from opposite sides thereof by the upper and lower sandwiching sections 2u and 2d, and air has been evacuated from the interior Ri of the laminated-substrate sandwiching unit 2 by means of the evacuator 3.

When the laminated substrate M has been softened after elapse of a preset time, the servomotor 54 is operated again in order to elevate the movable press platen 31d. The movable press platen 31d is stopped when the upper surface of the hot platen member 33d has reached a position corresponding to the thickness of an IC card to be fabricated, or when a preset force (torque) has been reached. As a result, the laminated-substrate sandwiching unit 2 is heated and pressed from above and below by means of the stationary press platen 31u and the movable press platen 31d, whereby the laminated substrate M undergoes thermocompression bonding. During this thermocompression bonding process, the pressure plates 21u and 21d of the laminated-substrate sandwiching unit 2 deform (expand) due to heat (high temperature). However, since such deformation is absorbed by the plurality of connection strips 23u and 23d, the laminated substrate M is thermally bonded under pressure by the paired pressure plates 21u and 21d having a high degree of parallelism. Accordingly, production yield (productivity) can be improved. In addition, the quality, homogeneity, and commercial value of IC cards can be improved.

Figure 8:
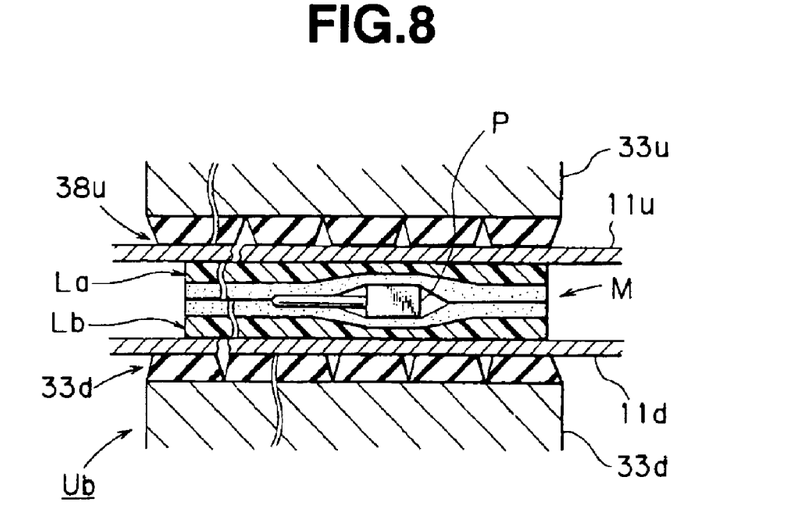
FIG. 8 is a schematic vertical cross section of the main portion used for explaining operation of the IC-card manufacturing apparatus.

In the course of thermocompression bonding of the laminated substrate M, application of pressure to the laminated substrate M starts in a state in which the laminated substrate M has not been heated to a sufficient degree, so that pressure is exerted to the electronic component P via the laminate materials La and Lb not having been softened to a sufficient degree. However, as shown in FIG. 7, since the pressure plates 21u and 21d formed of an elastic material elastically deform in accordance with deformations of the laminate materials La and Lb, which deformations occur due to presence of the electronic component P, the deformations of the laminate materials La and Lb are absorbed by the pressure plates 21u and 21d and the cushion sheets 38u and 38d. When a certain period of time has elapsed and the laminate materials La and Lb have been softened to a sufficient degree, the pressure plates 21u and 21d elastically restore their original shapes, and, as shown in FIG. 8, the laminated substrate M undergoes thermocompression bonding between the pressure plates 21u and 21d having the restored flat shapes. In the present embodiment, since the grooves v having a predetermined width are formed on the cushion sheets 38u and 38d to thereby form the large number of projections 39u and 39d, the cushion sheets 38u and 38d provide a sufficiently high degree of heat conductivity and a sufficient and appropriate degree of elasticity.

Subsequently, upon elapse of a preset pressure-application time (e.g., about 20 sec), the movable press platen 31d is descended, as shown in FIG. 6, and the laminated substrate M having undergone thermocompression bonding (i.e., fabricated IC cards Mi) is transferred to the cooling unit in order to cool the laminated substrate M (i.e., the fabricated IC cards Mi). In the cooling process, the IC cards Mi are cooled while being pressed. In order to remove the IC cards Mi from the laminated-substrate sandwiching unit 2 after the cooling process, air is supplied to the interior Ri of the laminated-substrate sandwiching unit 2 from the evacuation port 26i. As a result of air supply, the laminated-substrate sandwiching unit 2 is released from the evacuated state, and the IC cards Mi separate from the laminated-substrate sandwiching unit 2. Therefore, the fabricated IC cards Mi can be removed after the upper sandwiching section 2u is raised.

While the present invention has been described with reference to the preferred embodiment, the present invention is not limited thereto. Regarding structural details, shape, quantity, material, numerical values, among others, modifications and any omission or addition may be possible as needed without departing from the scope of the invention. For example, although the embodiment exemplifies the case in which the evacuation mechanism section 4 is integrated with the pre-heating unit Ua for pr-heating the laminated-substrate sandwiching unit 2, the evacuation mechanism section 4 may be configured independently of the pre-heating unit Ua. Moreover, the configuration and material of the laminated substrate M (IC cards Mi) are not limited to those employed in the embodiment, and the laminated substrate M (IC cards Mi) may have a different configuration and/or may be made from a different material.

What is claimed is:

1. An IC-card manufacturing apparatus for manufacturing an IC card from a laminated substrate including an electronic component and laminate materials which sandwich the electronic component, the IC-card manufacturing apparatus comprising:

a laminated-substrate sandwiching unit which includes upper and lower sandwiching sections for sandwiching the laminated substrate in a sealed state;

an evacuation unit for evacuating air from an interior of the laminated-substrate sandwiching unit; and an evacuation mechanism section which sandwiches the laminated-substrate sandwiching unit in order to form an upper evacuation chamber above the upper sandwiching section and a lower evacuation chamber below the lower sandwiching section and which evacuates air from the upper and lower evacuation chambers by use of the evacuation unit, wherein the laminated-substrate sandwiching unit includes upper and lower plates fixed to upper and lower frames respectively, so that the sandwiching unit encloses the laminated substrate in a sealed state, and wherein the evacuation mechanism section includes upper and lower platens having upper and lower seal members respectively that contact the sandwiching unit, thereby forming the upper and the lower evacuation chambers.

2. The IC-card manufacturing apparatus according to claim 1, wherein the evacuation mechanism section evacuates air from the interior of the laminated-substrate sandwiching unit, the upper evacuation chamber, and the lower evacuation chamber under the same negative pressure.

3. The IC-card manufacturing apparatus according' to claim 1, wherein the evacuation mechanism section includes a controller for starting and stopping evacuation of air from the interior of the laminated-substrate sandwiching unit and evacuation of air from the upper and lower evacuation chambers.

4. The IC-card manufacturing apparatus according to claim 3, wherein when air is evacuated from the interior of the laminated-substrate sandwiching unit, the controller starts evacuation of air from the upper and lower evacuation chambers simultaneously with the air evacuation from the interior of the laminated-substrate sandwiching unit, and stops the evacuation of air from the upper and lower evacuation chambers upon elapse of a predetermined period of time after the start of evacuation.

5. The IC-card manufacturing apparatus according to claim 1, wherein the evacuation mechanism section is provided at a pre-heating unit for pre-heating the laminated-substrate sandwiching unit.

6. The IC-card manufacturing apparatus according to claim 5, wherein the upper seal member is disposed between an upper surface of the upper sandwiching section and an upper heating surface located on an upper side of the pre-heating unit, the position of the upper seal member coincides with that of an inner seal member disposed between the upper sandwiching section and the lower sandwiching section, and the lower seal member is disposed between a lower surface of the lower sandwiching section and a lower heating surface located on a lower side of the pre-heating unit, and the position of the lower seal member coincides with that of the inner seal member.

7. The IC-card manufacturing apparatus according to claim 5, wherein the evacuation mechanism section includes a controller for controlling the pre-heating unit.

8. The IC-card manufacturing apparatus according to claim 7, wherein the controller causes the pre-heating unit to pre-heat the laminated-substrate sandwiching unit simultaneously with the evacuation.

* * * * *